United States Patent
Yang et al.

(10) Patent No.: US 12,051,841 B2
(45) Date of Patent: Jul. 30, 2024

(54) RADIO FREQUENCY AMPLIFICATION PROCESSING CIRCUIT AND COMMUNICATION TERMINAL

(71) Applicant: SMARTER MICROELECTRONICS (SHANGHAI) CO., LTD., Shanghai (CN)

(72) Inventors: Xue Yang, Shanghai (CN); Baiming Xu, Shanghai (CN); Qiang Su, Shanghai (CN); Jiangtao Yi, Shanghai (CN); Yang Li, Shanghai (CN)

(73) Assignee: SMARTER MICROELECTRONICS (SHANGHAI) CO., LTD., Shanghai (CN)

( * ) Notice: Subject to any disclaimer, the term of this patent is extended or adjusted under 35 U.S.C. 154(b) by 299 days.

(21) Appl. No.: 16/683,736

(22) Filed: Nov. 14, 2019

(65) Prior Publication Data
US 2020/0083580 A1    Mar. 12, 2020

Related U.S. Application Data

(63) Continuation of application No. PCT/CN2017/104491, filed on Sep. 29, 2017.

(30) Foreign Application Priority Data

May 15, 2017    (CN) .......................... 201710339100.0

(51) Int. Cl.
*H01P 1/212*    (2006.01)
*H01Q 11/12*    (2006.01)
(Continued)

(52) U.S. Cl.
CPC ............. *H01P 1/212* (2013.01); *H01Q 11/12* (2013.01); *H03F 1/56* (2013.01); *H04B 1/006* (2013.01);
(Continued)

(58) Field of Classification Search
CPC ........... H01P 1/212; H01Q 11/12; H04F 1/56; H04B 1/006; H04B 1/0458; H04B 1/48;
(Continued)

(56) References Cited

U.S. PATENT DOCUMENTS

2001/0017576 A1*  8/2001  Kondo .................... H01P 1/387
                                                                     333/24.2
2007/0146077 A1*  6/2007  Matsuda ................ H03H 7/383
                                                                     330/302

(Continued)

*Primary Examiner* — Nguyen T Vo
(74) *Attorney, Agent, or Firm* — Syncoda LLC; Feng Ma

(57) ABSTRACT

A radio frequency amplification processing circuit includes: a radio frequency power amplifier, a transmitting antenna and a filter element; the radio frequency power amplifier is configured to perform radio frequency amplification on a modulated first wireless communication signal, and transmit, with a first line, the amplified first wireless communication signal to the transmitting antenna for transmission, or perform radio frequency amplification on a modulated second wireless communication signal, and transmit, with a second line, the amplified second wireless communication signal to the filter element; and the filter element is configured to filter the amplified second wireless communication signal, and transmit, also with the second line, the filtered second wireless communication signal to the transmitting antenna for transmission.

9 Claims, 2 Drawing Sheets

(51) Int. Cl.
  *H03F 1/56*     (2006.01)
  *H04B 1/00*     (2006.01)
  *H04B 1/04*     (2006.01)
  *H04B 1/18*     (2006.01)
  *H04B 1/48*     (2006.01)

(52) U.S. Cl.
  CPC ............. *H04B 1/0458* (2013.01); *H04B 1/48* (2013.01); *H04B 2001/0416* (2013.01); *H04B 1/18* (2013.01)

(58) Field of Classification Search
  CPC ..... H04B 1/18; H04B 2001/0416; H03F 1/56; H03F 1/565; H03F 2200/111; H03F 2200/451; H03F 3/19; H03F 3/245; H03H 7/0115; H03H 7/1758; H03H 7/38
  See application file for complete search history.

(56) References Cited

U.S. PATENT DOCUMENTS

| | | | | |
|---|---|---|---|---|
| 2009/0111401 | A1* | 4/2009 | Itkin | H04B 1/0483 |
| | | | | 455/127.3 |
| 2015/0181459 | A1* | 6/2015 | Zhu | H04L 43/087 |
| | | | | 370/236 |
| 2017/0171791 | A1* | 6/2017 | Li | H04W 36/06 |
| 2017/0194921 | A1* | 7/2017 | Arkiszewski | H03F 3/193 |
| 2018/0069574 | A1* | 3/2018 | Kondo | H04B 1/005 |
| 2018/0083583 | A1* | 3/2018 | Tsutsui | H03F 1/56 |
| 2018/0183483 | A1* | 6/2018 | Kogure | H03F 1/56 |
| 2018/0227008 | A1* | 8/2018 | Obiya | H04B 1/0458 |
| 2020/0021318 | A1* | 1/2020 | Sawada | H04B 1/006 |

* cited by examiner

RADIO FREQUENCY AMPLIFICATION PROCESSING CIRCUIT AND COMMUNICATION TERMINAL

CROSS-REFERENCE TO RELATED APPLICATION

The present application is a continuation of, and claims priority to, PCT/CN2017/104491 filed on Sep. 29, 2017, which in turn claims priority to Chinese Patent Application No. 201710339100.0, filed on May 15, 2017, the disclosures of which are hereby incorporated by reference in their entirety.

BACKGROUND

A wireless communication public network used by a mobile communication terminal has been developed to include fourth-generation (4G) and fifth-generation (5G) mobile communication networks.

However, due to the timing and stage of construction of the wireless communication public network, a second generation (2G) and a third-generation (3G) mobile communication networks are still used.

SUMMARY

The present disclosure relates generally to the technical fields of wireless communication signal transceiving processing, and in particular to a radio frequency amplification processing circuit and a communication terminal.

Various embodiments of the present disclosure provide a circuit for radio frequency amplification processing and a communication terminal, such that a manufacture cost of a radio frequency amplification circuit and a debugging difficulty of an amplifier can be reduced.

To this end, the technical solutions in various embodiments of the disclosure can be implemented as follows.

Some embodiments of the disclosure provide a circuit for radio frequency amplification processing, which includes: a radio frequency power amplifier, a transmitting antenna and a filtering component.

The radio frequency power amplifier is configured to perform radio frequency amplification on a power of a modulated first wireless communication signal, and transmit an amplified first wireless communication signal to the transmitting antenna via a first line for transmission. Or the radio frequency power amplifier is configured to perform radio frequency amplification on a power of a modulated second wireless communication signal, and transmit an amplified second wireless communication signal to the filtering component via a second line.

The filtering component is configured to perform filtering processing on the amplified second wireless communication signal, and transmit a filtered second wireless communication signal to the transmitting antenna via the second line for transmission.

In the above embodiments, the circuit further includes a selection switch. A fixed end of the selection switch is connected to an output of the radio frequency power amplifier, and a selection end of the selection switch is selectively connected to the first line or the second line according to a control signal.

In the above embodiments, the circuit further includes an isolated filtering component, configured to perform isolated filtering on a transmitted signal and a received signal. The isolated filtering component is located on the first line between the radio frequency power amplifier and the transmitting antenna.

In the above embodiments, the circuit further includes an impedance matching component, configured to perform impedance matching on the radio frequency power amplifier according to a load impedance of the transmitting antenna. An input of the impedance matching component is connected to the radio frequency power amplifier, and an output of the impedance matching component is selectively connected to the first line or the second line according to the control signal.

In the above embodiments, the filtering component is a harmonic filter.

Some embodiments of the disclosure further provide a communication terminal, which includes a down-conversion component, a low-noise amplifier, a signal modulation component, a medium frequency amplifier, an up-conversion component and a circuit for radio frequency amplification processing. The circuit for radio frequency amplification processing includes a radio frequency power amplifier, a transmitting antenna and a filtering component.

The radio frequency power amplifier is configured to perform radio frequency amplification on a power of a modulated first wireless communication signal, and transmit an amplified first wireless communication signal to the transmitting antenna via a first line for transmission. Or the radio frequency power amplifier is configured to perform radio frequency amplification on a power of a modulated second wireless communication signal, and transmit an amplified second wireless communication signal to the filtering component via a second line.

The filtering component is configured to perform filtering processing on the amplified second wireless communication signal, and transmit a filtered second wireless communication signal to the transmitting antenna via the second line for transmission.

In the above embodiments, the circuit for radio frequency amplification processing further includes a selection switch. A fixed end of the selection switch is connected to an output of the radio frequency power amplifier, and a selection end of the selection switch is selectively connected to the first line or the second line according to a control signal.

In the above embodiments, the circuit for radio frequency amplification processing further includes an isolated filtering component, configured to perform isolated filtering on a transmitted signal and a received signal. The isolated filtering component is located on the first line between the radio frequency power amplifier and the transmitting antenna.

In the above embodiments, the circuit for radio frequency amplification processing further includes an impedance matching component, configured to perform impedance matching on the radio frequency power amplifier according to a load impedance of the transmitting antenna. An input of the impedance matching component is connected to the radio frequency power amplifier, and an output of the impedance matching component is selectively connected to the first line or the second line according to the control signal.

In the above embodiments, the communication terminal further includes a master control chip. The master control chip is configured to send, according to a determined type of a wireless communication signal, a control signal for controlling the selection switch to connect to the first line or the second line.

In the circuit for radio frequency amplification processing and the communication terminal according to the embodiments of the disclosure, the radio frequency amplification is performed on the power of the modulated first wireless communication signal, and the amplified first wireless communication signal is transmitted to the transmitting antenna via the first line for transmission. Or the radio frequency amplification is performed on the power of the modulated second wireless communication signal, the amplified second wireless communication signal is transmitted to the filtering component via the second line to perform filtering processing, and the filtered second wireless communication signal is transmitted to the transmitting antenna via the second line for transmission. Therefore, in the embodiments of the disclosure, multiple network types and multiple frequency bands of mobile communication signals that can be originally processed by two or more radio frequency power amplifiers are processed by a same radio frequency power amplifier. Then the additional filtering component is provided for the 2G mobile communication signal to perform harmonic power suppression and base frequency impedance conversion processing for transmission. Therefore, the use of two radio frequency power amplifiers is avoided, a space of the printed board to be occupied by the radio frequency power amplifiers is reduced, a wiring design of a circuit is simplified, and a manufacture cost of the radio frequency amplification circuit and a debugging difficulty of the amplifier are reduced.

DETAILED DESCRIPTION

Figure 1:
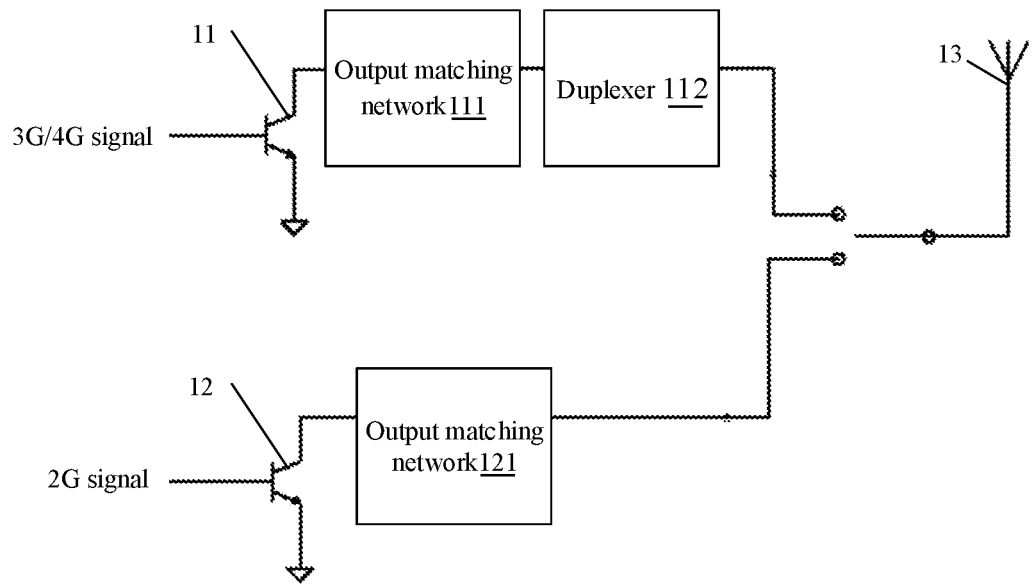
FIG. 1 is a schematic diagram illustrating a principle of a circuit for radio frequency amplification processing of a wireless communication signal.

The inventors of the present disclosure have recognized that, a mobile communication terminal may need to transmit or receive not only 4G and/or 5G mobile communication signals, but also 2G and 3G mobile communication signals. Because the 2G mobile communication signal needs a larger power output, a lower load impedance and a stricter harmonic suppression requirement, it is common to use more than one radio frequency power amplifier in radio frequency power amplification before the existing wireless communication signal is transmitted. However, it is inevitable to occupy more space of a printed board, increase a manufacture cost and a debugging difficulty of the amplifier. It is found by the inventor in research that, in order to adapt the development of a mobile communication network, two radio frequency power amplifiers may be configured to respectively amplify 3G and 4G mobile communication signals and a 2G mobile communication signal. As illustrated in FIG. 1, the circuit for radio frequency amplification processing can include radio frequency power amplifiers 11 and 12, output matching networks 111 and 121, a duplexer 112 and an antenna 13.

However, since the two radio frequency power amplifiers need to occupy much space of a printed board, a manufacture cost is increased. The two radio frequency power amplifiers need to be connected via a trace in board layout. Within a radio frequency range, the trace always has a parasitic effect and is easily coupled to peripheral components. Indexes such as an output power, a load impedance and a harmonic power of the radio frequency power amplifier will be affected by the parasitic effect and the coupling. Therefore, the two radio frequency power amplifiers are used, which results in that much space of the printed board is occupied, a manufacture cost is increased, and a debugging difficulty of the amplifier is increased.

Some embodiments of the disclosure provide a circuit for radio frequency amplification processing, which includes: a radio frequency power amplifier, a transmitting antenna and a filtering component.

The radio frequency power amplifier is configured to perform radio frequency amplification on a power of a modulated first wireless communication signal, and transmit an amplified first wireless communication signal to the transmitting antenna via a first line for transmission. Or the radio frequency power amplifier is configured to perform radio frequency amplification on a power of a modulated second wireless communication signal, and transmit an amplified second wireless communication signal to the filtering component via a second line.

The filtering component is configured to perform filtering processing on the amplified second wireless communication signal, and transmit the filtered second wireless communication signal to the transmitting antenna via the second line for transmission.

By applying the circuit for radio frequency amplification processing according to the embodiment of the disclosure, multiple types of wireless communication signals are processed by the same radio frequency power amplifier, and an additional filtering component is provided for the 2G mobile communication signal therein to perform harmonic power suppression and base frequency impedance conversion processing for transmission. Therefore, the use of two or more radio frequency power amplifiers is avoided, space of a printed board to be occupied by the radio frequency power amplifiers is reduced, a wiring design of the circuit is simplified, and a manufacture cost of the radio frequency amplification circuit and a debugging difficulty of the amplifier are reduced.

Herein, the multiple types of wireless communication signals may include various wireless communication signals to be subjected to radio frequency amplification. It not only may include various existing mobile communication network types of signals including 2G, 3G and 4G, but also may include wireless-fidelity (Wi-Fi) and worldwide interoperability for microwave access (WiMAX) signals, and may further be other wireless communication signals to be subjected to the radio frequency amplification, which will not be listed one by one.

In implementations, the mobile communication network types of signals may include 2G global system for mobile communication (GSM)/code division multiple access (CDMA), time division-synchronous code division multiple access (TD-SCDMA)/code division multiple access 2000 (CDMA2000)/wideband code division multiple access (WCDMA) in 3G mobile communication and time division long term evolution (TD-LTE)/frequency division duplexing long term evolution (FDD-LTE) in 4G mobile communication, etc.

Each mobile communication network type of signal may further include multiple frequency bands, e.g., the GSM mobile communication network type may support multiple frequency bands such as 850 M, 900 M, 1800 M and 1900 M.

In these embodiments of the disclosure, the second wireless communication signal is a wireless communication signal needing a larger power output, a lower load impedance and a stricter harmonic suppression requirement, and the first wireless communication signal is other wireless communication signal except that the second signal.

In some embodiments, the first wireless communication signal may be a wireless communication signal in a 3G mobile communication network type or in a more advanced mobile communication network type in the mobile communication network types of signals, including existing 3G mobile communication network type and 4G mobile communication network type, and may also be a Wi-Fi signal or a WiMAX signal. The second wireless communication signal may be a communication signal in 2G mobile communication network type.

The radio frequency power amplifier may be a bipolar junction transistor, and may also be a field effect transistor (FET) or a metal oxide semiconductor (MOS) transistor.

In practical use, the radio frequency power amplifier is preferably the bipolar junction transistor. The bipolar junction transistor may be a bipolar junction transistor for processing a 2G wireless communication signal in the related art, and may also be a bipolar junction transistor for processing a 3G wireless communication signal or a more advanced wireless communication signal.

In implementations, for various different signals, it is necessary to adjust parameters of the radio frequency power amplifier.

When the signal is a communication signal in the 3G mobile communication network type or in a more advanced mobile communication network type, the radio frequency power amplifier is adjusted based on a transmitting requirement of the communication signal in the 3G mobile communication network type or in a more advanced mobile communication network type.

When the signal is a Wi-Fi signal or a WiMAX signal, the radio frequency power amplifier is adjusted based on a transmitting requirement of the Wi-Fi signal or the WiMAX signal.

When the signal is a communication signal in the 2G mobile communication network type, the radio frequency power amplifier is adjusted based on a transmitting requirement of the communication signal in the 2G mobile communication network type.

Herein, the parameters of the radio frequency power amplifier may be adjusted in a power and a bandwidth. Generally, the radio frequency power amplifier is adjusted by a terminal device where the radio frequency power amplifier is located.

The second line is used for transmitting a wireless communication signal needing a larger power output, a lower load impedance and a stricter harmonic suppression requirement, and the first line is used for transmitting other wireless communication signals.

In some embodiments, the first line is used for transmitting a communication signal in the 3G mobile communication network type or in a more advanced mobile communication network type, a Wi-Fi signal and a WiMAX signal. The second line is used for transmitting a communication signal in the 2G mobile communication network type.

Since the second wireless communication signal needs a larger power output, a lower load impedance and a stricter harmonic suppression requirement, the second line is further provided with a filtering component that can perform harmonic power suppression and base frequency impedance conversion on a signal.

In some embodiments, the filtering component may be a harmonic filter.

In some embodiments, the circuit for radio frequency amplification processing further includes a selection switch. A fixed end of the selection switch is connected to an output of the radio frequency power amplifier, and a selection end of the selection switch is selectively connected to the first line or the second line according to a control signal.

In this way, the selection on whether an output of the radio frequency power amplifier is transmitted to the transmitting antenna via the first line or the second line for transmission may be made via the selection switch. Generally, the selection switch is controlled by a terminal device where the circuit for radio frequency amplification processing is located.

In some embodiments, the circuit for radio frequency amplification processing further includes an isolation component, configured to isolate a transmitted signal from a received signal. The isolation component is located on the first line between the radio frequency power amplifier and the transmitting antenna.

Generally, uplink and downlink signals of the communication signal in the 3G mobile communication network type or in a more advanced mobile communication network type, the Wi-Fi signal and the WiMAX signal are received and transmitted via the same transmitting antenna. Therefore, the isolation component may need to be configured to isolate the uplink and downlink signals to avoid the mutual influence therebetween.

In implementations, the isolation component may be a duplexer.

In some embodiments, the circuit for radio frequency amplification processing further includes an impedance matching component, configured to perform impedance matching on the radio frequency power amplifier according to a load impedance of the transmitting antenna. An input of the impedance matching component is connected to the radio frequency power amplifier, and an output of the impedance matching component is selectively connected to the first line or the second line according to the control signal.

In order to improve a transmitting power of the signal, it is required to perform output impedance matching processing satisfying a transmitting requirement of the communication signal in the 3G mobile communication network type or in a more advanced mobile communication network type on the radio frequency power amplifier.

Since the communication signal in the 2G mobile communication network type has a requirement of a higher power, the output impedance matching satisfying the transmitting requirement of the communication signal in the 3G mobile communication network type or in a more advanced mobile communication network type needs to be performed on the radio frequency power amplifier first. In case of the communication signal in the 2G mobile communication network type, further processing is performed additionally on this basis, i.e., the signal enters the second line for further processing.

In implementations, the impedance matching component may be an output matching network (OMN).

An embodiment of the disclosure further provides a communication terminal, which includes a down-conversion component, a low-noise amplifier, a signal modulation component, a medium frequency amplifier, an up-conversion component and a circuit for radio frequency amplification processing. The circuit for radio frequency amplification processing includes a radio frequency power amplifier, a transmitting antenna and a filtering component.

The radio frequency power amplifier is configured to perform radio frequency amplification on a power of a modulated first wireless communication signal, and transmit an amplified first wireless communication signal to the transmitting antenna via a first line for transmission. Or the radio frequency power amplifier is configured to perform radio frequency amplification on a power of a modulated second wireless communication signal, and transmit an amplified second wireless communication signal to the filtering component via a second line.

The filtering component is configured to perform filtering processing on the amplified second wireless communication signal, and transmit a filtered second wireless communication signal to the transmitting antenna via the second line for transmission.

In some embodiments, the circuit for radio frequency amplification processing further includes a selection switch. A fixed end of the selection switch is connected to an output of the radio frequency power amplifier, and a selection end of the selection switch is selectively connected to the first line or the second line according to a control signal.

In some embodiments, the circuit for radio frequency amplification processing further includes an isolation component, configured to isolate a transmitted signal from a received signal. The isolation component is located on the first line between the radio frequency power amplifier and the transmitting antenna.

In some embodiments, the circuit for radio frequency amplification processing further includes an impedance matching component, configured to perform impedance matching on the radio frequency power amplifier according to a load impedance of the transmitting antenna. An input of the impedance matching component is connected to the radio frequency power amplifier, and an output of the impedance matching component is selectively connected to the first line or the second line according to the control signal.

In some embodiments, the communication terminal further includes a master control chip, configured to send, according to a determined type of a wireless communication signal, a control signal for controlling the selection switch to connect to the first line or the second line.

In some embodiments, the master control chip is further configured to adjust parameters of the radio frequency power amplifier according to the determined type of the wireless communication signal.

The disclosure will be further described below in detail in combination with accompanying drawings and embodiments. It should be understood that the embodiments provided herein are merely for explaining the disclosure and are not intended to limit the disclosure. Additionally, the embodiments provided below are a part of embodiments for implementing the disclosure but not all embodiments for implementing the disclosure. The technical solution in the embodiments of the disclosure may be implemented in any combined manner in case of no conflict.

First Embodiment

Figure 2:
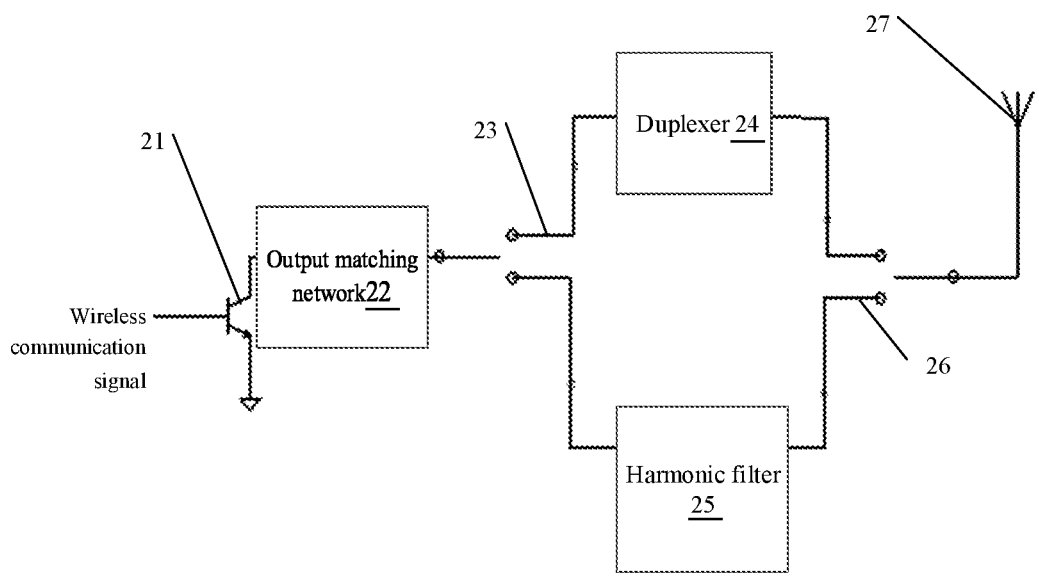
FIG. 2 is a schematic diagram illustrating a principle of a circuit for radio frequency amplification processing according to some embodiments of the disclosure.

FIG. 2 is a schematic diagram illustrating a principle of a circuit for radio frequency amplification processing according to a first embodiment of the disclosure. As illustrated in FIG. 2, the circuit for radio frequency amplification processing includes a radio frequency power amplifier 21, an output matching network 22, a first selection switch 23, a duplexer 24, a harmonic filter 25, a second selection switch 26 and a transmitting antenna 27.

An output of the radio frequency power amplifier 21 is connected to the output matching network 22. An output of the output matching network 22 is connected to the first selection switch 23. The first selection switch 23 may be selectively connected to the duplexer 24 or the harmonic filter 25. The duplexer 24 or the harmonic filter 25 may be connected to the transmitting antenna 27.

The radio frequency power amplifier 21 is configured to amplify various wireless communication signals to be subjected to radio frequency amplification.

In implementations, the wireless communication signals to be subjected to the radio frequency amplification not only may include signals in mobile communication network types including 2G/3G/4G, but also may include WiFi and WiMAX signals.

The output matching network 22 is configured to perform impedance matching on the radio frequency power amplifier 21 according to a load impedance of the transmitting antenna 27.

In other words, the impedance matching is performed on the radio frequency amplifier first for any signal (a communication signal having a low requirement in the 3G mobile communication network type or in a more advanced mobile communication network type).

Figure 3:
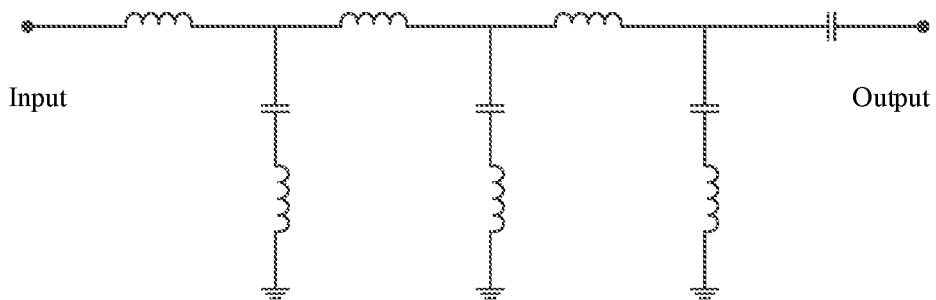
FIG. 3 is a schematic structural diagram of an output matching network illustrated in FIG. 2.

In this embodiment, the output matching network 22 may be an output matching network in which multiple LC resonance circuits are parallel connected, and the structure is as illustrated in FIG. 3.

The first selection switch 23 is configured to select, according to a network type of a signal, a line trend of the output of the output matching network 22.

When the signal is a signal in a 3G mobile communication network type or in a more advanced mobile communication network type, a WiFi signal or a WiMAX signal, the first selection switch 23 is switched, and the output matching network 22 is connected to the duplexer 24.

When the signal is a signal in a 2G mobile communication network type, the first selection switch 23 is switched, and the output matching network 22 is connected to the harmonic filter 25.

The first selection switch 23 may be controlled by a master control chip of a terminal device where the circuit for radio frequency amplification processing is located.

The duplexer 24 is configured to isolate, when the signal is a communication signal in a 3G mobile communication network type or in a more advanced mobile communication network type, the signal from a signal received by the transmitting antenna 27.

Uplink and downlink signals of the communication signal in the 3G mobile communication network type or in a more advanced mobile communication network type are received and transmitted via the same transmitting antenna 27, therefore, the duplexer 24 is mainly configured to isolate the uplink and downlink signals to avoid the mutual influence therebetween.

The harmonic filter 25 is configured to perform harmonic power suppression and base frequency impedance conversion on the signal when the signal is a communication signal in a 2G mobile communication network type.

The harmonic filter 25 not only may be configured to perform the harmonic power suppression, but also may be configured to perform the base frequency impedance conversion, so that the signal power is improved, and a transmitting requirement of the communication signal in the 2G mobile communication network type is satisfied.

Figure 4:
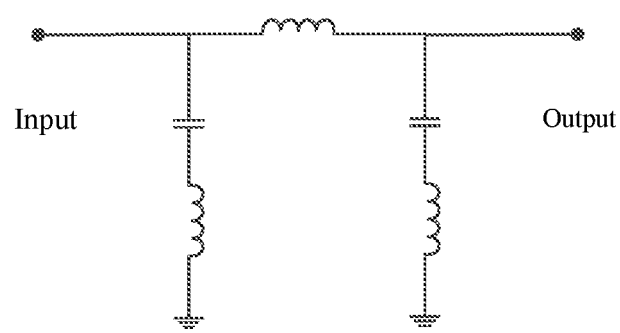
FIG. 4 illustrates a schematic structural diagram of a harmonic filter illustrated in FIG. 2.

A structure of the harmonic filter 25 is illustrated in FIG. 4.

The second selection switch 26 is configured to determine, according to the network type of the signal, which of the duplexer 24 or the harmonic filter 25 is connected to the transmitting antenna 27.

The master control ship in the terminal device where the circuit for radio frequency amplification processing is located performs linkage control on the second selection switch 26 and the first selection switch 23.

Second Embodiment

In this embodiment, a communication terminal is provided, which includes a master control chip, a down-conversion component, a low-noise amplifier, a signal modulation component, a medium frequency amplifier, an up-conversion component and a circuit for radio frequency amplification processing.

A composition structure of the circuit for radio frequency amplification processing, connection relationship between the components, and a functional principle of each component is the same as the description in the first embodiment, and will no longer be described.

The master control chip is configured to control, according to a determined type of a wireless communication signal, the selection switch to connect to a first line or a second line.

In some embodiments, the master control chip determines a type of a to-be-transmitted wireless communication signal according to a network where the communication terminal is located, and sends, according to the determined type of the wireless communication signal, a control signal for controlling the selection switch to connect to the first line or the second line.

The master control chip is further configured to adjust parameters of the radio frequency power amplifier according to the determined type of the wireless communication signal.

The above are only the preferred embodiments of the disclosure and are not intended to limit a scope of protection of the disclosure. Any modification, equivalent substitution, improvement and the like made within the spirit and principle of the disclosure should be included in the scope of protection of the disclosure.

The circuit for radio frequency amplification processing in the embodiments of the disclosure includes a radio frequency power amplifier, a transmitting antenna and a filtering component. The radio frequency power amplifier is configured to perform radio frequency amplification on a power of a modulated first wireless communication signal, and transmit an amplified first wireless communication signal to the transmitting antenna via a first line for transmission. Or the radio frequency power amplifier is configured to perform radio frequency amplification on a power of a modulated second wireless communication signal, and transmit the amplified second wireless communication signal to the filtering component via a second line. The filtering component is configured to perform filtering processing on the amplified second wireless communication signal, and transmit a filtered second wireless communication signal to the transmitting antenna via the second line for transmission. By applying the circuit for radio frequency amplification processing, a manufacture cost of the radio frequency amplification circuit and a debugging difficulty of the amplifier can be reduced.

The invention claimed is:

1. A communication terminal comprising a circuit for radio frequency amplification processing, comprising a radio frequency power amplifier, a transmitting antenna, an impedance matching component, and a filtering component, wherein
   the radio frequency power amplifier is configured to be adjusted based on a transmitting requirement, and perform radio frequency amplification on a power of a modulated first wireless communication signal, and transmit an amplified first wireless communication signal to the transmitting antenna via a first line for transmission; and perform radio frequency amplification on a power of a modulated second wireless communication signal, and transmit an amplified second wireless communication signal to the impedance matching component via a second line;
   the impedance matching component is configured to:
   perform impedance matching on the amplified second wireless communication signal; an input of the impedance matching component is connected to the radio frequency power amplifier, and an output of the impedance matching component is selectively connected to the first line or the second line according to a control signal; and
   transmit a matched second wireless communication signal to the filtering component via the second line; and
   the filtering component is configured to perform both harmonic power suppression and base frequency impedance conversion on the matched second wireless communication signal, and transmit a filtered second wireless communication signal to the transmitting antenna via the second line for transmission;
   wherein the harmonic power suppression and the base frequency impedance conversion are configured for further impedance matching for the matched second wireless communication signal received at the filtering component via the second line, thereby reducing a need for two or more radio frequency power amplifiers; and
   wherein the amplified second wireless communication signal is further impedance matched by the filtering component such that the amplified second wireless communication signal is twice-matched, at both the impedance matching component and the filtering component, and further processed at the second line for a higher power requirement than the amplified first wireless communication signal.

2. The communication terminal of claim 1, wherein the circuit further comprises an isolated filtering component, configured to perform isolated filtering on a transmitted signal and a received signal, and the isolated filtering component is located on the first line between the radio frequency power amplifier and the transmitting antenna.

3. The communication terminal of claim 1, wherein the filtering component is a harmonic filter.

4. The communication terminal of claim 1, wherein multiple network types and multiple frequency bands of mobile communication signals are processed by the only radio frequency power amplifier.

5. The communication terminal of claim 1, further comprising a selection switch, wherein a fixed end of the selection switch is connected to an output of the radio frequency power amplifier, and a selection end of the selection switch is selectively connected to the first line or the second line according to the control signal.

6. The communication terminal of claim 1, further comprising:
a first selection switch, a fixed end of the selection switch is connected to an output of the radio frequency power amplifier, and a selection end of the selection switch is selectively connected to the first line or the second line according to a control signal; and
a second selection switch configured to couple the amplified first wireless communication signal to the transmitting antenna through a single duplexer, or couple the filtered second wireless communication signal to the transmitting antenna through the filtering component; and
wherein the amplified first wireless communication signal comprises a third-generation (3G) mobile communication network signal, a fourth-generation (4G) mobile communication network signal, a wireless-fidelity (Wi-Fi) signal, and a worldwide interoperability for microwave access (WiMAX) signal;
wherein the radio frequency power amplifier is the only radio frequency power amplifier of the circuit for radio frequency amplification processing;
wherein the first selection switch is configured to couple the amplified second wireless communication signal comprising second-generation (2G) mobile communication signals to the filtering component via the second line bypassing the single duplexer; and
wherein the communication terminal further comprises:
a master control chip configured to send, according to a determined type of a wireless communication signal, the control signal for controlling the selection switch to connect to the first line or the second line.

7. A communication terminal, comprising a circuit for radio frequency amplification processing, wherein the circuit for radio frequency amplification processing comprises a radio frequency power amplifier, a transmitting antenna, an impedance matching component, and a filtering component;
the radio frequency power amplifier is configured to be adjusted based on a transmitting requirement, and perform radio frequency amplification on a power of a modulated first wireless communication signal, and transmit an amplified first wireless communication signal to the transmitting antenna via a first line for transmission; and perform radio frequency amplification on a power of a modulated second wireless communication signal, and transmit an amplified second wireless communication signal to the filtering component via a second line; and
the filtering component is configured to perform both harmonic power suppression and base frequency impedance conversion on the amplified second wireless communication signal, and transmit a filtered second wireless communication signal to the transmitting antenna via the second line for transmission;
wherein the circuit for radio frequency amplification processing further comprises:
a first selection switch, a fixed end of the first selection switch is connected to an output of the radio frequency power amplifier, and a selection end of the first selection switch is selectively connected to the first line or the second line according to a control signal; and
a second selection switch configured to couple the amplified first wireless communication signal to the transmitting antenna through a single duplexer, or couple the filtered second wireless communication signal to the transmitting antenna through the filtering component; and
wherein the amplified first wireless communication signal comprises a third-generation (3G) mobile communication network signal, a fourth-generation (4G) mobile communication network signal, a wireless-fidelity (Wi-Fi) signal, and a worldwide interoperability for microwave access (WiMAX) signal;
wherein the radio frequency power amplifier is the only radio frequency power amplifier of the circuit for radio frequency amplification processing;
wherein the first selection switch is configured to couple the amplified second wireless communication signal comprising second-generation (2G) mobile communication signals to the filtering component via the second line bypassing the single duplexer, wherein the amplified second wireless communication signal has a higher power requirement of the transmitting requirement than the amplified first wireless communication signal;
wherein the communication terminal further comprises a master control chip configured to send, according to a determined type of the wireless communication signal, the control signal for controlling the first selection switch to connect to the first line or the second line;
wherein the harmonic power suppression and the base frequency impedance conversion are configured for further impedance matching for matched second wireless communication signal received at the filtering component via the second line, thereby reducing a need for two or more radio frequency power amplifiers; and
wherein the amplified second wireless communication signal is further impedance matched by the filtering component such that the amplified second wireless communication signal is twice-matched, at both the impedance matching component and the filtering component, and further processed at the second line for the higher power requirement of the transmitting requirement than the amplified first wireless communication signal.

8. The communication terminal of claim 7, wherein the circuit for radio frequency amplification processing further comprises an isolated filtering component, configured to perform isolated filtering on a transmitted signal and a received signal, and the isolated filtering component is located on the first line between the radio frequency power amplifier and the transmitting antenna.

9. The communication terminal of claim 7, wherein the impedance matching component is configured to perform impedance matching on the radio frequency power amplifier according to a load impedance of the transmitting antenna; and an input of the impedance matching component is connected to the radio frequency power amplifier, and an output of the impedance matching component is selectively connected to the first line or the second line according to the control signal.

* * * * *